(12) United States Patent
Weitz

(10) Patent No.: US 6,608,796 B2
(45) Date of Patent: Aug. 19, 2003

(54) CIRCUIT CONFIGURATION FOR CONTROLLING THE WORD LINES OF A MEMORY MATRIX

(75) Inventor: Peter Weitz, Sauerlach (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/114,772

(22) Filed: Apr. 2, 2002

(65) Prior Publication Data

US 2002/0141278 A1 Oct. 3, 2002

(30) Foreign Application Priority Data

Apr. 2, 2001 (DE) .......................................... 101 16 327

(51) Int. Cl.[7] ................................................ G11C 8/00
(52) U.S. Cl. .......................... 365/230.06; 365/230.03; 365/230.08; 365/145
(58) Field of Search ................................. 365/145, 200, 365/201, 226, 230.03, 230.06, 230.08

(56) References Cited

U.S. PATENT DOCUMENTS 6,215,712 B1 * 4/2001 Yanagisawa ................ 365/201
6,330,180 B2 * 12/2001 Noro et al. .................. 365/145

FOREIGN PATENT DOCUMENTS

DE    196 14 561 A1    10/1996
EP    0 019 241 A1    11/1980

* cited by examiner

Primary Examiner—Hoai Ho
Assistant Examiner—Long Tran
(74) Attorney, Agent, or Firm—Laurence A. Greenberg; Werner H. Stemer; Ralph E. Locher

(57) ABSTRACT

A circuit configuration for performing a selective changeover of word lines of a memory matrix between an activation potential and a deactivation potential uses selectively addressable drivers. The changeover of a word line input terminal from the activation potential to the deactivation potential is effected through the relevant driver if a deactivation signal is brought to an active state by a timing control circuit. In order to accelerate the deactivation of the word lines, a respectively assigned deactivation auxiliary switch is connected to each of the word lines at at least one terminal remote from the input terminal. The deactivation auxiliary switch is controlled by a timing control circuit such that it connects the remote terminal to the deactivation potential practically at the same instant at which the assigned driver changes the input terminal of the relevant word line from the activation potential over to the deactivation potential.

11 Claims, 6 Drawing Sheets

CIRCUIT CONFIGURATION FOR CONTROLLING THE WORD LINES OF A MEMORY MATRIX

BACKGROUND OF THE INVENTION

FIELD OF THE INVENTION

The invention relates to a circuit configuration for controlling the word lines of a memory matrix. The invention is preferably used for dynamic random access memory devices (DRAMs) but is not limited to DRAMs and may advantageously be used for other types of memory devices.

In customary digital information memories, the memory cells form a matrix of rows and columns. In order to select a memory cell for reading from or writing to, a "word line" assigned to the relevant row is activated and a "bit line" assigned to the relevant column is addressed. A word line is activated by the application of an activation potential which conditions the assigned memory cells in such a way that they can be accessed via the bit lines in order to read or write memory information. After the reading or writing operation has been effected on the row, the relevant word line is deactivated again by being brought to a deactivation potential which cancels the aforementioned conditioning of the memory cells again.

For optional activation and deactivation, an assigned driver is connected to each word line. The respective driver and hence the relevant word line is selected through the use of a row address decoder which receives the bits of a digital row address. Each driver is, in principle, a switching device which, depending on control signals, establishes a low-impedance connection between the relevant word line and either a source of the activation potential or a source of the deactivation potential.

In the most customary cases, the drivers are provided at one of the column-parallel edges of the memory matrix and are connected to the "inputs" of the word lines that are situated there. If a signal is fed in at this location, then it propagates with a certain propagation speed along the line since the line behaves like an RC delay chain, principally on account of the distributed transverse capacitance in conjunction with the longitudinal resistance. After a changeover of the potential at the line input, with increasing distance from the input it thus takes increasingly longer until other locations on the line reach the full amplitude of the new potential.

This propagation time limits the maximum possible operating speed of the memory. In a customary operating mode, after a write or read cycle, the deactivation potential is applied to the word lines and a next cycle is permitted to be begun only when the potential has been established over the entire length of the word lines, including the word line that was selected in the preceding cycle, and, accordingly, the concluding precharge can be effected via the relevant row. The interval to be complied with here ("row precharge time", abbreviated to "TRP") must thus comply with the signal propagation time from the input to the end of the word line. The aforementioned intervals governed by the propagation time become a problem particularly in the case of large memory matrices with correspondingly long word lines. Enlarging the driver circuits cannot afford a temporal advantage here.

A limitation of the operating speed by the signal propagation time on the word line can be combated in a known manner by providing and connecting each driver in the center of the respective word line, so that the propagation time to the most distant point on the word line is halved. A further known solution proposal is the so-called "segmented word line" concept which, in principle, utilizes an even finer subdivision of the word line length. However, both concepts significantly increase the chip area. This is because space is taken up not only by the transistors of the drivers themselves but also by their leads, which have to run at an appropriate distance from one another and from the elements and lines of the memory matrix. This is because the leads must include all those lines which both control the selection of the relevant driver and command the activation or deactivation to be performed by the respective drivers; added to them are the leads for the activation potential and the deactivation potential. All these leads each have to be led to the locations of the relevant drivers, partly as a bundle firstly in the row direction to the location of the drivers and then in the column direction along all the driver circuits.

SUMMARY OF THE INVENTION

It is accordingly an object of the invention to provide a circuit configuration which overcomes the above-mentioned disadvantages and which implements at least the commanded deactivation of word lines of a memory matrix in an accelerated fashion.

With the foregoing and other objects in view there is provided, in accordance with the invention, in combination with a memory matrix having word lines and memory cells connected to the word lines, the word lines having respective input terminals and respective remote terminals provided remote from the input terminals, a circuit configuration for performing a selective changeover of the word lines between an activation potential enabling access to given ones of the memory cells connected to a given one of the word lines and a deactivation potential inhibiting access to the given ones of the memory cells, the circuit configuration including:

a plurality of selectively addressable drivers each connected to a respective one of the input terminals of a respectively assigned one of the word lines and each being controllable by an assigned selection signal and a deactivation signal in order to connect the respective one of the input terminals to the activation potential if the selection signal is in an active state and the deactivation signal is in an inactive state, and in order to connect the respective one of the input terminals to the deactivation potential when the deactivation signal becomes active;

a source for providing the deactivation potential;

a plurality of auxiliary circuits connected to respective ones of the word lines at at least a respective one of the remote terminals, the plurality of auxiliary circuits including respective deactivation auxiliary switches each of which, depending on an assigned auxiliary switching signal, selectively establishes and inhibits a low-impedance conductive connection between a respective one the remote terminals and the source for providing the deactivation potential; and a timing control circuit generating the respectively assigned auxiliary switching signal in a temporal relationship with the deactivation signal such that a corresponding one of the deactivation auxiliary switches is turned off while a corresponding one of the selectively addressable drivers of an assigned one of the word lines connects a corresponding one of the input terminals to the activation potential, and is turned on again as soon as the corresponding one of the selectively addressable drivers connects the corresponding one of the input terminals to the deactivation potential as a result of the deactivation signal becoming active.

In other words, the invention is realized in a circuit configuration for the selective changeover of the word lines of a memory matrix between an activation potential, which enables access to memory cells connected to the relevant word line, and a deactivation potential, which inhibits access to the memory cells, having a plurality of selectively addressable drivers, each of which is connected to an input terminal of a respectively assigned specimen of the word lines and can be controlled under the influence of an assigned selection signal and of a deactivation signal in order to put the relevant input terminal at the activation potential if the selection signal (AS) is in the active state and the deactivation signal is in the inactive state, and in order to put the relevant input terminal (11) at the deactivation potential (L) when the deactivation signal becomes active. According to the invention, a respectively assigned auxiliary circuit is connected to each of the word lines at at least one terminal point remote from the input terminal, which auxiliary circuit contains a deactivation auxiliary switch which, depending on an assigned auxiliary switching signal, establishes or inhibits a low-impedance conductive connection between the terminal point and a source of the deactivation potential. A timing control circuit is provided, which generates the respective auxiliary switching signal in a temporal relationship with the deactivation signal such that the deactivation auxiliary switch is turned off while the driver of the assigned word line puts the relevant input terminal at the activation potential, and is turned on again as soon as the driver puts the relevant input terminal at the deactivation potential as a result of the deactivation signal becoming active.

In addition to achieving the object mentioned above, the invention has the advantage that the auxiliary circuits at the remote terminal points of the word lines require far fewer leads than if respective complete and selectively addressable drivers were provided at the terminal points.

According to another feature of the invention, the timing control circuit generates a common auxiliary switching signal for all of the deactivation auxiliary switches such that the common auxiliary switching signal keeps all of the deactivation auxiliary switches turned off while any of the selectively addressable drivers connects a corresponding one of the input terminals of one of the word lines to the activation potential, and turns all of the deactivation auxiliary switches on again as soon as the selectively addressable drivers connect the input terminals of all of the word lines to the deactivation potential as a result of the deactivation signal becoming active.

According to yet another feature of the invention, the timing control circuit generates the common auxiliary switching signal such that, after all of the deactivation auxiliary switches have been turned on, the common auxiliary switching signal turns the deactivation auxiliary switches off again at an earliest when, starting from a changeover of one of the input terminals to the deactivation potential, a time has elapsed which corresponds to a signal propagation time via the word lines from one of the input terminals to one of the remote terminals, and at a latest when any of the selectively addressable drivers changes one of the input terminals over again to the activation potential.

According to a further feature of the invention, the word lines form a total set divided into m≧2 disjoint sets, m being an integer value, such that between given ones of the word lines which each belong to a same given one of the disjoint sets there are m−1 word lines which do not belong to the given one of the disjoint sets; the timing control circuit generates m separate auxiliary switching signals each respectively controlling exactly those of the deactivation auxiliary switches which are in each case connected to a same one of the disjoint sets; and the timing control circuit generates the auxiliary switching signals depending on an addressing of the selectively addressable drivers such that each of the auxiliary switching signals turns off given ones of the deactivation auxiliary switches controlled by the auxiliary switching signals, only for a respective duration of intervals in which a respective one of the selectively addressable drivers connects one of the input terminals of one of the word lines of a corresponding one of the disjoint sets to the activation potential.

According to another feature of the invention, each of the deactivation auxiliary switches is a transistor with a main current path connected between a respective one of the remote terminals and the source for providing the deactivation potential and the transistor has a control electrode for receiving an assigned one of the auxiliary switching signals.

According to yet a further feature of the invention, each of the deactivation auxiliary switches is a field-effect transistor.

According to another feature of the invention, each of the auxiliary circuits further includes an activation auxiliary switching device receiving the assigned auxiliary switching signal and going into a standby state if the auxiliary switching signal turns off a corresponding one of the deactivation auxiliary switches; and the activation auxiliary switching device responds, when in the standby state, to a potential at a corresponding one of the remote terminals in order to establish a low-impedance connection between the corresponding one of the remote terminals and a source providing the activation potential if the potential at the corresponding one of the remote terminals has risen from the deactivation potential toward the activation potential by a threshold amount equal to a fraction of a difference between the deactivation potential and the activation potential, and in order to inhibit the low-impedance connection again at an earliest when a time has elapsed corresponding to a signal propagation time via the word lines from one of the input terminals to one of the remote terminals, and at a latest when the auxiliary switching signal turns on a corresponding one of the deactivation auxiliary switches in a corresponding one of the auxiliary circuits.

According to another feature of the invention, the activation auxiliary switching device inhibits the low-impedance connection again when the auxiliary switching signal turns on a corresponding one of the deactivation auxiliary switches in a corresponding one of the auxiliary circuits.

According to another feature of the invention, the activation auxiliary switching device includes:

an activation auxiliary switch having a control input and having a switching path connected between a corresponding one of the remote terminals and the source providing the activation potential;

a threshold switch having a control input connected to the corresponding one of the remote terminals and having a switching path connected between a line carrying the auxiliary switching signal and the control input of the activation auxiliary switch;

a discharge switch having a control input connected to the corresponding one of the remote terminals and having a control path connected between the control input of the activation auxiliary switch and the source providing the activation potential;

the threshold switch is in an on state only when a potential at the control input of the threshold switch reaches or exceeds the threshold amount;

the activation auxiliary switch is in an on state only when the control input of the activation auxiliary switch receives a potential which turns a corresponding one of the deactivation auxiliary switches off; and the discharge switch is in an on state only when the control input of the discharge switch receives the deactivation potential.

According to another feature of the invention, each of the deactivation auxiliary switches, the activation auxiliary switch, the threshold switch, and the discharge switch in each of the auxiliary circuits are field-effect transistors.

According to another feature of the invention, in each of the auxiliary circuits, a respective one of the field-effect transistors forming the discharge switch is configured for a lower saturation current than a respective one of the field-effect transistors forming the activation auxiliary switch.

Other features which are considered as characteristic for the invention are set forth in the appended claims.

Although the invention is illustrated and described herein as embodied in a circuit configuration for controlling the word lines of a memory matrix, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
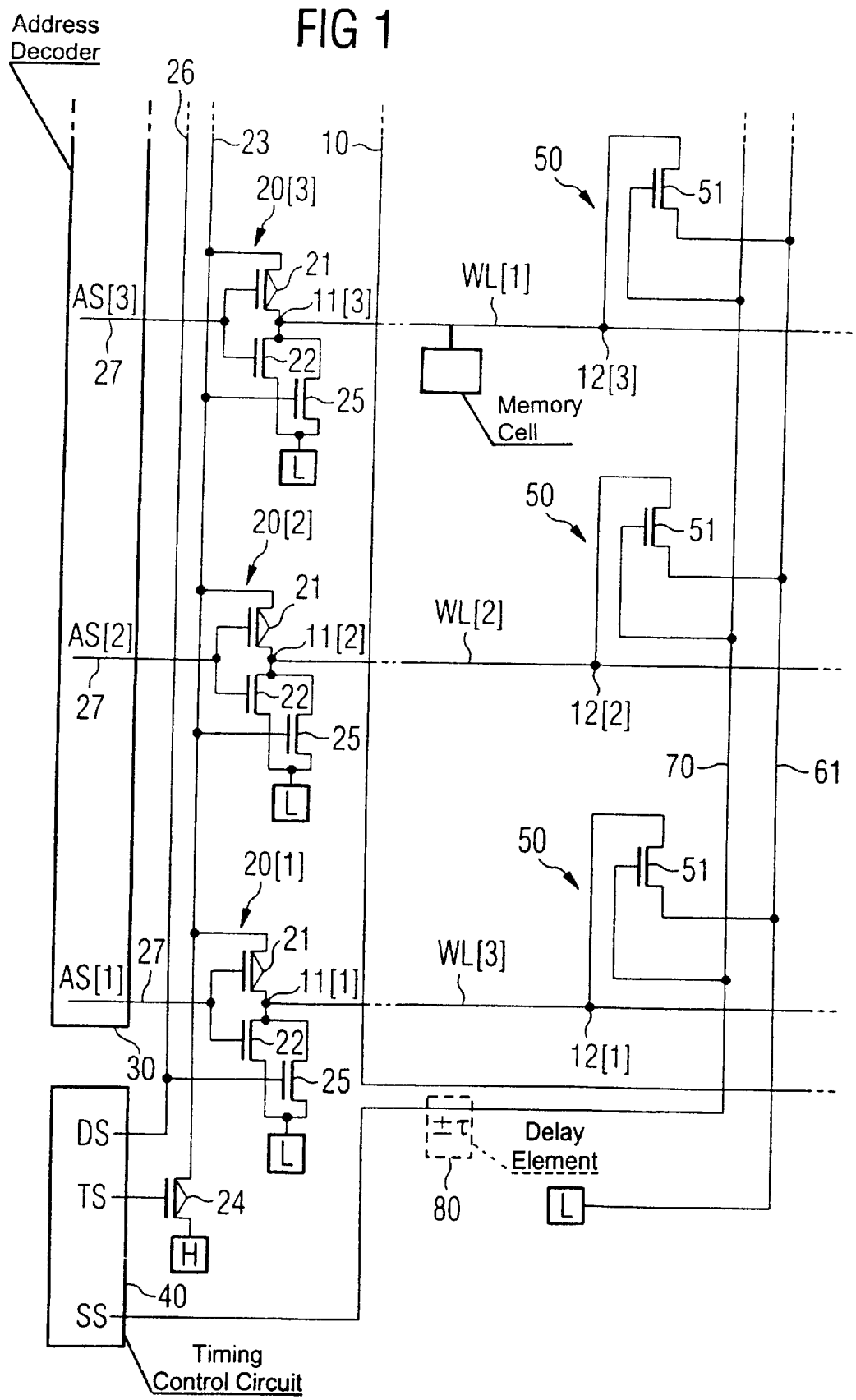
FIGS. 1 to 4 are schematic circuit diagrams of four different embodiments of a circuit configuration according to the invention.

Referring now to the figures of the drawings in detail and first, particularly, to FIG. 1 thereof, there is shown a frame line 10 which illustrates part of the contour of a memory matrix through which a plurality of word lines WL run in the row direction (horizontally in the plane of the drawing) and a plurality of bit lines run in the column direction (vertically). For reasons of clarity, only three specimens of the word lines are depicted fragmentarily in the form of horizontal lines. The bit lines run transversely with respect to the word lines. Situated near each crossover between a word line WL and a bit line is a memory cell which can be accessed by driving the relevant word line and bit line in order to write or read information, as generally known.

In the description below and in the drawings, the reference symbols which serve for identifying the various signals and circuit elements sometimes have a numeral in square brackets [ ] appended to them, the numeral specifying the number of that respective specimen of the word lines to which the relevant element or signal is specifically assigned.

For driving the word lines WL, an assigned word line driver 20 is connected to an input terminal 11 at the left-hand end of each of the lines. The drivers 20 are of a conventional configuration and are all constructed identically, for which reason a brief description and simplified illustrative representation of just one specimen will suffice.

Accordingly, each driver 20 contains a P-channel field-effect transistor (P-FET) 21 and an N-channel field-effect transistor (N-FET) 22. The source-drain path (channel) of the P-FET 21 leads from the word line terminal 11 to a common activation line 23, which is connected to a source of a first potential H via the channel of a P-FET 24. The interconnected gates of the P-FET 21 and N-FET 22 in each driver 20 receive, via a selection line 27, a selection signal AS specifically assigned to this driver from an address decoder 30. The channel of the N-FET 22 in each driver 20 leads from the word line terminal 11 to a source of a second potential L. A further N-FET 25 is in each case connected in parallel with each N-FET 22, and the gates of all the N-FETs 25 receive a deactivation signal DS from a timing control circuit 40 via a common deactivation line 26. The timing control circuit 40 furthermore supplies an activation signal TS to the gate of each P-FET 24.

Figure 5:
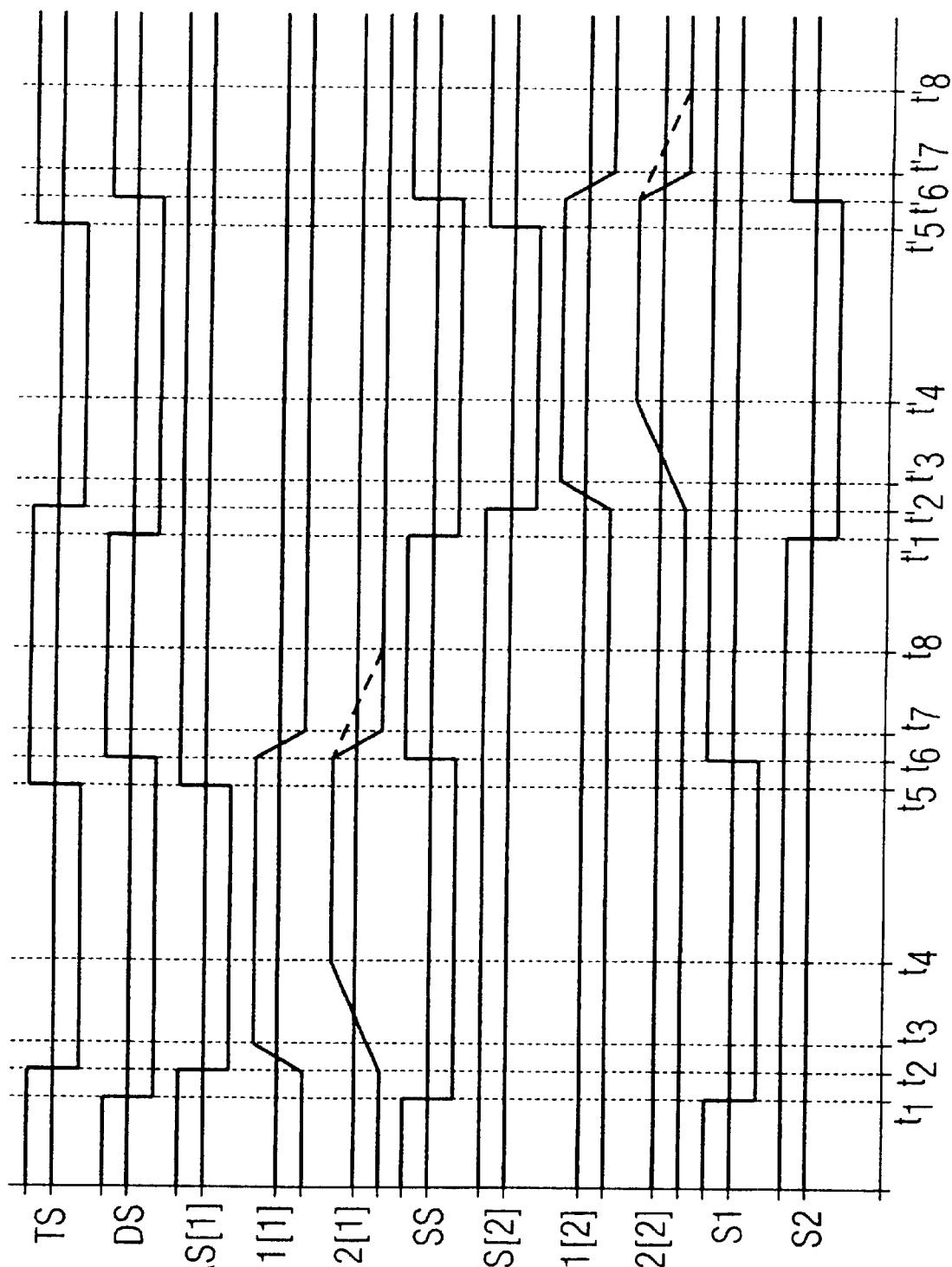
FIG. 5 is a timing diagram for illustrating the temporal profile of potentials at various locations in the circuit configurations according to FIGS. 1 and 2.

The potential H for the circuit illustrated is the "high" logic level (binary value 1), which forms the activation potential for the word lines WL and is positive relative to the "low" logic level L (binary value 0), which forms the deactivation potential for the word lines. FIG. 5 shows, against a common time axis and in an idealized manner, the temporal profile of the potential levels for various signals and circuit points, the high level being depicted above the respective center line and the low level below the respective center line.

In the case illustrated, the selection signal AS and the activation signal TS are so-called "active low" signals, i.e. their active state is the low level (L). The deactivation signal DS is an "active high" signal, i.e. its active state is the high level (H). In the quiescent state, before the instant t1 in FIG. 5, all the selection signals AS, the activation signal TS and the deactivation signal DS are high, i.e. AS and TS are inactive and DS is active, so that, in all of the drivers, the P-FET 21 is turned off and the N-FETS 22 and 25 are in the on state and, accordingly, all of the word lines WL are at deactivation potential L.

In order to activate a word line, firstly, before the instant t1, the relevant word line address is applied to the address decoder 30 and decoded there. After the conclusion of the decoding operation, that is to say when the address is "valid", the address decoder 30, at the instant t2, switches the selection signal AS precisely for that driver 20 which is assigned to the addressed word line WL from the previously high level to the low level. If the addressed word line is e.g. the first word line WL [1], then only the selection signal AS [1] becomes high, so that the P-FET 21 only of the relevant driver 20 [1] becomes conductive and the assigned N-FET 22 becomes non-conductive. At the same time, or better still shortly beforehand, at the instant t1, the timing control circuit 40 brings the deactivation signal DS to the low level, so that the N-FETs 25 of all the drivers turn off. Shortly after this turn-off or blocking, the timing control circuit 40 brings the activation signal TS to the low level, at the instant t2 in the case illustrated, so that the P-FET 24 is turned on. This holds the input terminal 11 [1] of the addressed word line WL [1] (and only of this word line) in the direction of the activation potential H, which is reached relatively quickly at the instant t3, as is shown by the assigned waveform for 11 [1] in FIG. 5.

After the writing or reading operation on the memory cells connected to the activated word line WL, the deactivation interval is initiated in that, at the instant t5, the signals AS, TS and shortly afterward, at the instant t6, also the signal DS are brought to the high level again, so that the P-FETs 21 in all of the drivers 20 turn off and the N-FETs 22 and 25 in all of the drivers are turned on. This holds the input terminals 11 of all the word lines to the L potential, which is reached relatively quickly at the instant t7 by the terminal 11 [1], which was previously at the H level.

The situation now present corresponds to the quiescent state before the instant t1 and is maintained for a certain duration until an instant t1', in order to carry out the precharge operation on the bit lines, in preparation for the next word line activation, e.g. the activation of the second word line WL [2]. Starting at t1', the same procedural sequence as was described above for the instants t2 to t7 ensues through the instants t2' to t7', except that the signal AS [2] rather than the signal AS [1] is active and the terminal 11 [2] rather than the terminal 11 [1] is pulled to the H level, as shown by the waveform for 11 [2] in FIG. 5.

The circuitry and method of operation described up to now is known. As mentioned further above, problems can arise because, on account of signal delay along the word line WL, it takes a certain time until a change in potential impressed at the terminal point 11 has developed to remote locations of the word line WL. This is illustrated in FIG. 5 by the waveforms 12 [1] and 12 [2], which show the potential profile at remote locations 12 of the word lines WL [1] and WL [2] for the operation described above. The relevant remote locations 12 [1] and 12 [2] do not reach the full activation potential until a time significantly later than the input terminals 11 [1] and 11 [2], respectively, at the instants t4 and t4', respectively, in the case illustrated. In a similar manner, if no special precautions are taken, the remote locations would reach the full deactivation potential with a significant delay relative to the input terminals assigned thereto, namely not until the instants t8 and t8', respectively, as shown by the dashed edges in FIG. 5. This last-mentioned delay is practically eliminated according to the invention through the use of the circuit measures shown in the right-hand half of FIG. 1.

In accordance with FIG. 1, a separate auxiliary circuit 50 is in each case connected to at least one point 12—remote from the input terminal 11—of each word line WL, the auxiliary circuit containing a controllable deactivation auxiliary switch whose switching path is connected between the terminal point 12 and a potential line 61 carrying the deactivation potential L. In the case illustrated, the switching path is formed by the channel of an N-FET 51.

In the exemplary embodiment according to FIG. 1, the gates of the N-FETs 51 of all the auxiliary circuits 50 are connected to a common control line 70, via which a switching signal SS is introduced. The switching signal SS can alternate between an "active" high level, which turns on the N-FETs 51 of the auxiliary circuits (N-FET is conducting), and a low level, which turns off the N-FETs 51 (N-FET is blocking). The switching signal SS is controlled by the timing control circuit 40 in a temporal relationship with the deactivation signal DS such that the N-FETs 51 in the auxiliary circuits 50 are turned on as far as possible exactly at those instants t7 and t7', respectively, at which the N-FETs 25 of the drivers 20 are turned on on account of the high level of the deactivation signal DS, and that the N-FETs 51 are not turned off before the instants t8 and t8', respectively, that is to say not earlier than before a time interval has elapsed which corresponds to the signal propagation time on the word lines WL from the respective input terminal 11 to the terminal point 12. Consequently, in the event of a desired deactivation, each terminal point 12 is also pulled to the L potential practically at the same time as the input terminal 11. This accelerates, in the desired manner, the deactivation of the word lines at locations remote from the input terminal.

In the embodiment according to FIG. 1, the active state (high level) of the switching signal SS at the gates of the P-FETs 51 of the auxiliary circuits 50 should be ended again at the latest when the next activation cycle begins with the turning-on of the P-FETs 21 in any of the drivers 20.

Figure 2:
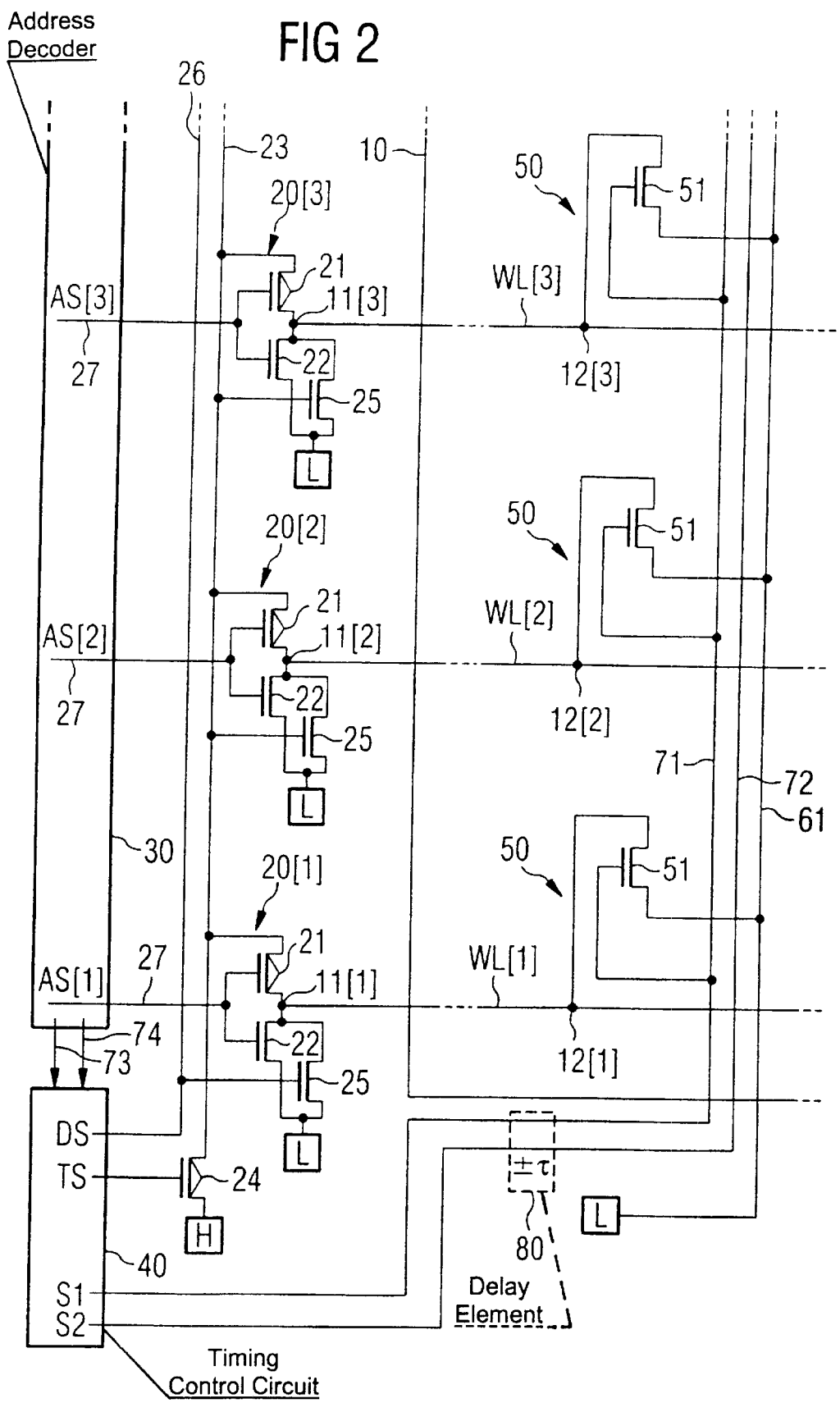

In the configuration according to FIG. 1, at the beginning of the activation interval, the respectively selected word line WL is changed over from the L potential to fixed H potential at the input terminal via the assigned P-FET 21, while the other word lines continue to be held at L potential at their input terminals via the N-FETs 22 which remain in the on state there. At all the remote terminal points 12, however, the L potential is decoupled, owing to the turn-off (blocking) of all the FETs 51, including on the non-activated word lines. Consequently, at locations remote from the input terminals 11, the non-activated word lines are receptive to interference signals that may arise, inter alia, through the capacitive interaction between the word lines. In particular, there may be the risk of the changeover edges upon activation and deactivation of the respectively selected word line leading to temporary potential surges on non-activated word lines, to the greatest extent on the specimens adjacent to the activated word line. FIG. 2 shows a modification of the configuration according to FIG. 1 which prevents this interference.

The configuration according to FIG. 2 differs from that according to FIG. 1 only by the fact that not all of the word lines are assigned the same switching signal SS, rather that instead two separately generated switching signals S1 and S2 are assigned to two different "disjoint" groups of word lines.

The first switching signal S1 goes to its inactive low level only when the activation of any word line of odd ordinal number begins, that is to say one of the word lines WL [1], WL [3], etc. The signal S1 is brought to the active high level again as soon as the subsequent deactivation interval begins. The signal S1 is applied via a first control line 71 to the N-FETs 51 of the auxiliary circuits only of the "odd" word lines. The second switching signal S2 goes to its inactive low level only when the activation of any word line of even ordinal number begins, that is to say the activation of one of the word lines WL [2], etc. The signal S2 is brought to the active high level again as soon as the subsequent deactivation interval begins. The signal S2 is applied via a second control line 72 to the N-FETs 51 of the auxiliary circuits only of the "even" word lines. This ensures that, in the event of activation of any arbitrary word line, always on both sides the respective nearest adjacent specimen at the location of the remote terminal points 12 remains constrained at the L level and, consequently, coupling-in of interference signals is avoided.

The selection of the switching signals S1 and S2 can be performed by the timing control circuit 40 on the basis of the word line address, as is symbolized by the connecting lines 73 and 74 from the address decoder 30 to the timing control circuit 40 in FIG. 2. For the sake of completeness, the switching signals S1 and S2 are also depicted in the diagram of FIG. 5, in the bottom two lines, for the case where firstly the first word line WL [1] and then the second word line WL [2] is addressed. Consequently, FIG. 5 also applies to the embodiment according to FIG. 2, with the proviso that in FIG. 5 the signals S1 and S2 replace the signal SS.

Figure 3:
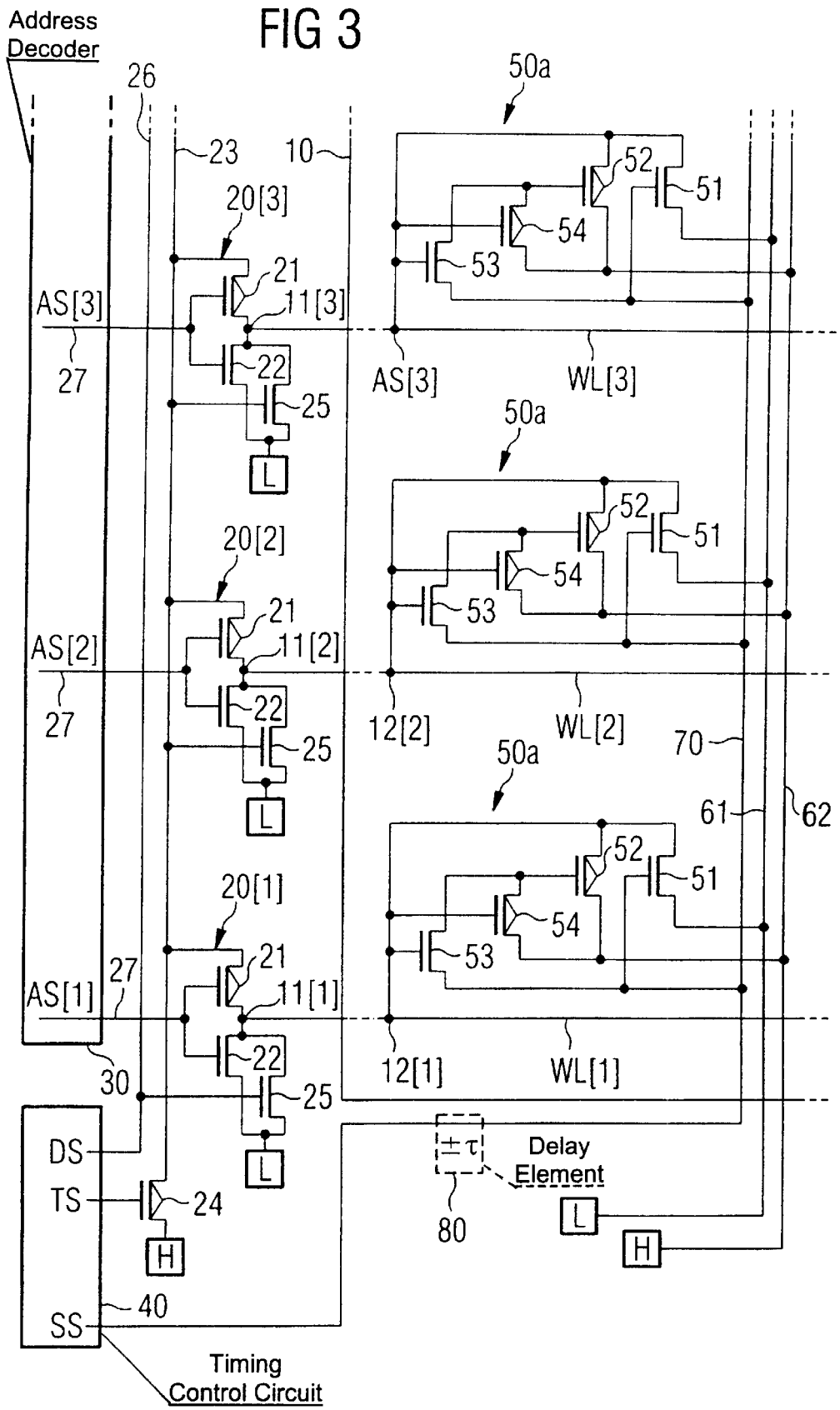

The auxiliary circuits 50 in the circuit configurations according to FIGS. 1 and 2 may be equipped with additional components as required, in order to accelerate not only the deactivation but also the activation of the word lines at remote locations on its length. In a customary operating mode of a memory matrix, writing externally or reading externally is permitted to be begin only when the activation potential applied to the selected word line WL has been established over the entire length of the line. This interval to be complied with between the beginning of the word line activation and the beginning of the bit line driving (row address strobe to column address strobe delay or "RAS to CAS delay", abbreviated to "TRCD") can be shortened if provision is made for establishing a direct connection to the activation potential H at the beginning of an activation interval even at the remote terminal points 12 of the selected word line. FIG. 3 shows circuit measures in this regard.

The circuit configuration according to FIG. 3 differs from that according to FIG. 1 only through supplementations in the auxiliary circuits. All the other parts of the circuit configuration, which are designated by the same reference numerals as in FIG. 1, are configured exactly in the same way, and operate in the same way, as has been described above with reference to that figure. This also applies to the N-FET 51 used as deactivation auxiliary switch.

In the embodiment according to FIG. 3, each auxiliary circuit 50a additionally contains an activation auxiliary switch in the form of a P-FET 52 whose channel is connected between the terminal point 12 of the assigned word line WL and a second potential line 62 carrying the activation potential H. An N-FET 53 configured as a threshold switch senses, at its gate, the potential of the word line at the terminal point 12 and is turned on as soon as the potential rises relative to the L level by a fraction of the difference between L level and H level. The source of the N-FET 53 receives the same switching signal (SS in FIG. 3), as the gate of the deactivation auxiliary switch 51, and its drain is connected to the gate of the activation auxiliary switch 52. The drain of the N-FET 53 is additionally connected to the H potential line 62 via the channel of a further P-FET 54. The gate of the P-FET 54 is connected to the terminal point 12 of the word line WL.

Figure 6:
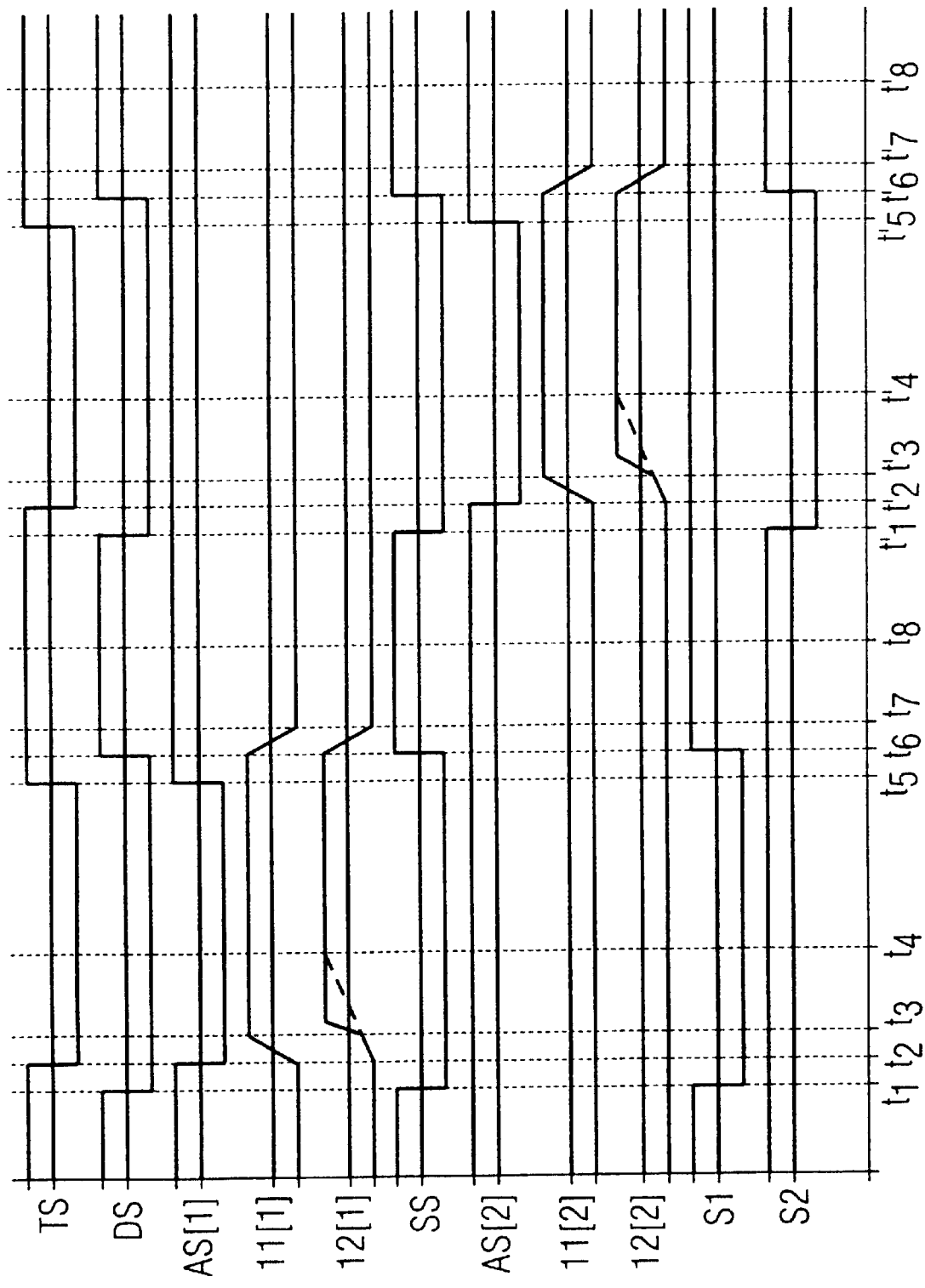
FIG. 6 is a timing diagram for illustrating the temporal profile of potentials at various locations in the circuit configurations according to FIGS. 3 and 4.

The operation of the circuit configuration according to FIG. 3 is described below with reference to the timing diagram according to FIG. 6. This diagram corresponds to that according to FIG. 5; all that is different is the time profile of the rising edges of the potential at the remote terminal points 12.

Before the beginning of an activation interval, e.g. before the instant t1 (or t1'), the switching signal SS is at high level, so that the N-FETs 51 of all the auxiliary circuits 50a are in the on state (conducting state) and constrain all of the word lines WL to the L level, as in the case of FIG. 1. The N-FET 53 is turned off, and the P-FET 54 is turned on, so that the P-FET 52 receives the H potential from the line 62 at its gate and is kept turned off.

In order to initiate an activation interval, e.g. at the instant t1 (or t1'), the switching signal SS becomes low, so that the N-FETs 51 of all the auxiliary circuits 40a turn off, and shortly afterward, at the instant t2 (or t2'), the input terminal 11 of the respectively selected word line, e.g. WL [1] (or WL [2]), changes to H potential, which it reaches at the instant t3 (or t3'). The potential rises more slowly at the remote terminal point 12, so that it would not reach the full H level until at the instant t4 (or t4'), as shown by broken lines in FIG. 6, if the auxiliary circuits 50a contained only the N-FET 51. In the case of FIG. 3, however, the N-FET 53 is already turned on in the event of a small potential rise ΔV, so that it couples the low potential of the switching signal SS to the gate of the P-FET 52, which is thus likewise turned on and rapidly pulls the terminal point 12 to the H potential of the line 62. This is the latest at which the P-FET 54 is turned off; until this time, although a current can flow from the H potential line 62 to the switching signal line 70 via the P-FET 54 and the N-FET 53, the current can be kept low and of short duration by dimensioning the P-FET 54 for a significantly lower saturation current than the N-FET 53.

It is advantageous for the response threshold ΔV of the N-FET to be dimensioned to be as low as possible, e.g. through the use of correspondingly low dimensioning of the threshold voltage of the N-FET 53, so that the terminal point 12 is pulled to the H potential as early as possible. However, the threshold must not be so low that any noise phenomena on the word line already leads to the response of the FET 53.

If, in order to initiate the deactivation interval, the switching signal SS goes to high potential again, e.g. at the instant t6 (or t6'), the turn-on of the N-FETs 51 of all the auxiliary circuits 40a again results in the accelerated changeover of the remote terminal points 12 to L potential, in the same way as was described above for the circuit configuration according to FIG. 1. As a result of this, the N-FET 53 is turned off again and the P-FET 54 is turned on again, so that the gate of the P-FET 52 is pulled to H potential, as a result of which the P-FET 52 turns off. After the precharge interval has elapsed, the procedural sequence described can be repeated with activation of another word line.

Figure 4:
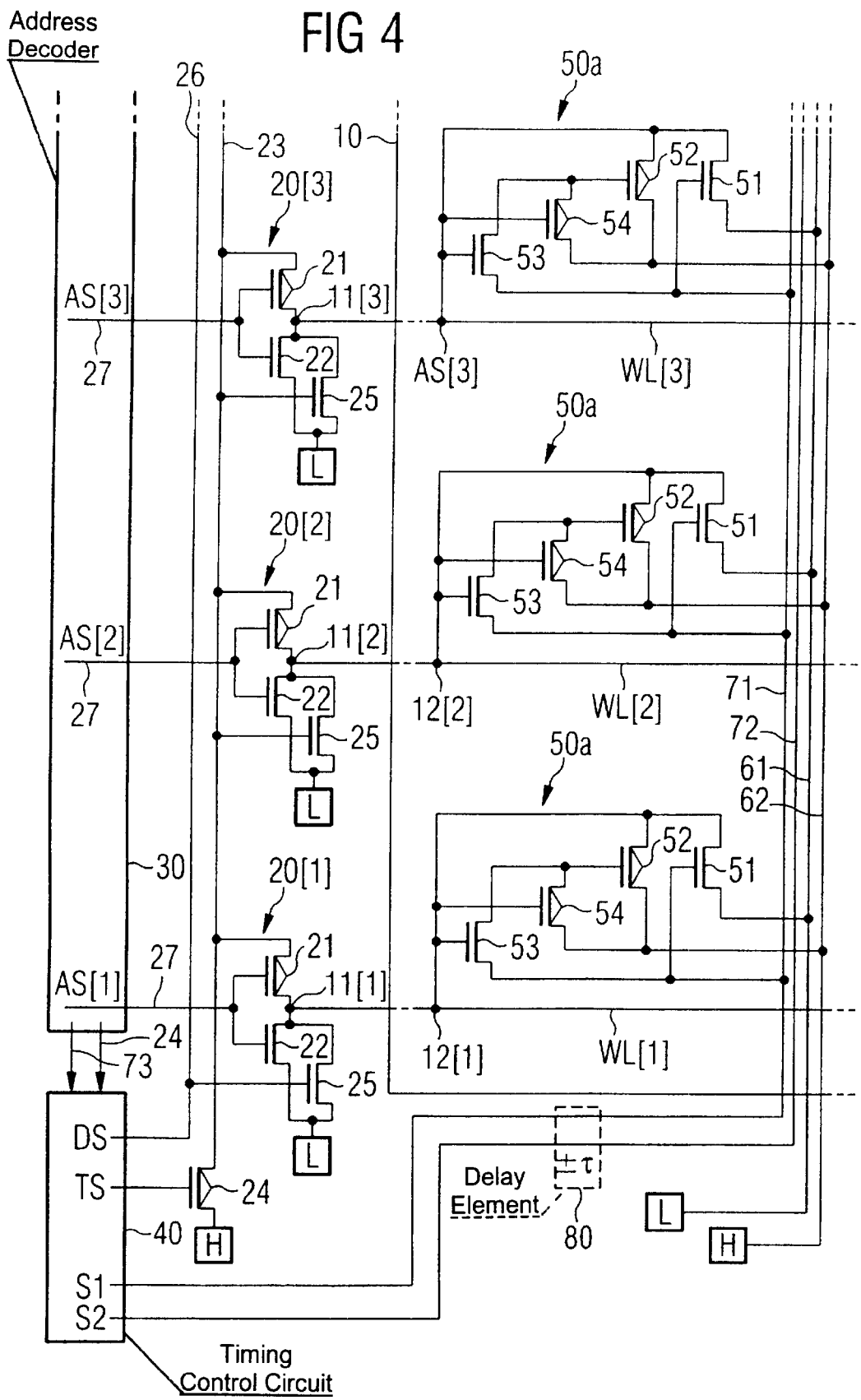

The circuit configuration according to FIG. 3 can also be modified in such a way that it operates with more than a single switching signal, e.g. with two separate switching signals S1 and S2, in a similar manner to the configuration shown in FIG. 2. Such a variant is shown in FIG. 4. The configuration according to FIG. 4 differs from that according to FIG. 3 only by the fact that not all of the word lines are assigned the same switching signal SS, rather instead two separately generated switching signals S1 and S2 are assigned to the auxiliary circuits 50a of different groups of word lines via separate lines 71 and 72. The pattern of this assignment is the same as in FIG. 2, and the switching signals S1 and S2 are generated in the same way, and bring about the same operations, as was described above with reference to FIG. 2, so that further explanation is unnecessary here. For the sake of completeness, the switching signals S1 and S2 are also depicted in the bottom two lines of the timing diagram in FIG. 6; consequently, this diagram also applies to the configuration according to FIG. 4 with the proviso that the signals S1 and S2 are valid instead of the signal SS.

Both when using the simple auxiliary circuits 50 which are shown in FIGS. 1 and 2 and accelerate only the deactivation, and when using the supplemented auxiliary circuits 50a which are shown in FIGS. 3 and 4 and accelerate the activation and the deactivation, it is also possible to use more than two separate switching signals and to allocate them to a corresponding number of disjoint groups of word lines WL. Stated generally, if this number is equal to m and if the word lines are numbered in accordance with their spatial succession in the memory matrix, each of these groups includes word lines whose ordinal numbers succeed one another at the interval m, so that m−1 other word lines lie between the word lines of each group. Each switching signal (S1 to Sm) is then controlled in such a way that it goes to its inactive low level only when the activation of any word line of the assigned group is initiated, and it is brought to the active high level again as soon as the subsequent deactivation interval is initiated. This ensures that, in the event of activation of any arbitrary word line, always on both sides the m−1 nearest adjacent specimens at the location of the remote terminal points 12 remain constrained at the L level. In the cases of FIGS. 2 and 4, m=2. The larger m is, the more reliable the protection of non-activated word lines against coupling-in of interference signals from the activated word line.

The above description and also the timing diagrams describe and show the timing position of the deactivation signal DS at the location of the drivers 20 and the timing position of the switching signals SS, S1 and S2 at the location remote from the drivers 20, where the auxiliary circuits 50 and 50*a*, respectively, are situated. In the generation of all these signals at their origin in the timing control circuit 40, it is necessary, of course, to take account of certain delay differences. The response time of the drivers 20 may differ from the response time of the auxiliary circuits 50 and 50*a*, respectively, and the signal propagation time of the deactivation signal DS to the location of the drivers 20 may differ from the propagation time of the switching signals SS, S1 and S2 to the auxiliary circuits 50 and 50*a*, respectively. Depending on the magnitude of these differences, which can be determined experimentally or computationally or by simulation for each circuit configuration, it may be necessary to have the switching signals lead or lag by a certain amount $\tau$ relative to the deactivation signal. The amount $\tau$ may be programmed in the timing control circuit 40 or be set by inserting correspondingly dimensioned delay elements into the control lines 70, 71, 72, as is indicated in broken lines by the elements 80 in FIGS. 1, 2, 3 and 4.

The circuit configurations which are described above and shown in the figures are only examples to which the invention is not restricted, of course. The activation signal TS may also simply be an inverted version of the deactivation signal DS and be applied directly to the drivers 20. The high level of this signal then forms the source of the H potential for the word lines WL. Instead of the driver circuits 20 as shown, it is also possible to use other driver systems with other kinds of driving, for example drivers without a separate deactivation transistor 25. In this case, the deactivation signal DS may be applied to the gates of the FETs 21 and 22, and the selection signals AS may be applied to those ends of the channels of the P-FETs 21 which are remote from the input terminals 11 (a separate activation signal can then be omitted; the high level of a selection signal AS then forms the source of the H potential for the word lines WL). As an alternative, it is also possible for the individual drivers 20 to be controlled only through the use of the selection signal AS, i.e. for the selection signal AS applied to the gates of the FETs 21 and 22 to be generated depending on the deactivation signal in such a way that it is constrained to the H level when the deactivation signal becomes active, and thereby turns off the P-FET 21 and turns on the N-FET 22 for the purpose of deactivating the relevant word line. This can be done e.g. through the use of a suitable logic in the address decoder 30, to which the deactivation signal DS is fed for this purpose from the timing control circuit 40, in order at least to pull the respectively relevant selection line 27 to H level, if desired all of the selection lines simultaneously (so-called "global reset"). In this case, too, it is possible to dispense with a separate activation signal TS at the drivers 20, and those ends of the channels of the P-FETs 21 which are remote from the input terminals 11 can be fixedly connected to H potential.

The auxiliary circuits 50 and 50*a*, respectively, can be accommodated within the memory matrix in widened gaps between bit line groups. In the case of very long word lines, it is also possible in each case for a plurality of auxiliary circuits 50 and 50*a*, respectively, to be connected at intervals to each word line, all the auxiliary circuits of the same word line in each case being controlled in the same way, if necessary with additional propagation-time-compensating delay elements in the control line sections between the auxiliary circuits that succeed one another along the word line.

As can be seen from FIGS. 1 to 4, it is possible to manage with relatively few leads to the location of the auxiliary circuits. There are only two such leads in the case of FIG. 1, one for the switching signal SS and one for the deactivation potential L. In the case of FIG. 3, all that is necessary in addition is a further lead for the activation potential H; in other words, only three leads are required if the auxiliary circuits are intended to accelerate both the deactivation and the activation. Just a single further lead (two switching signals instead of only one switching signal, in accordance with FIGS. 2 and 4) already brings about effective interference signal suppression on the non-activated word lines. Even better interference signal suppression is rarely necessary; only when it is nevertheless desired are more leads necessary, in order to carry m≧2 switching signals to their destination locations, as described above.

I claim:

1. In combination with a memory matrix having word lines and memory cells connected to the word lines, the word lines having respective input terminals and respective remote terminals provided remote from the input terminals, a circuit configuration for performing a selective changeover of the word lines between an activation potential enabling access to given ones of the memory cells connected to a given one of the word lines and a deactivation potential inhibiting access to the given ones of the memory cells, the circuit configuration comprising:

a plurality of selectively addressable drivers each connected to a respective one of the input terminals of a respectively assigned one of the word lines and each being controllable by an assigned selection signal and a deactivation signal in order to connect the respective one of the input terminals to the activation potential if the selection signal is in an active state and the deactivation signal is in an inactive state, and in order to connect the respective one of the input terminals to the deactivation potential when the deactivation signal becomes active;

a source for providing the deactivation potential;

a plurality of auxiliary circuits connected to respective ones of the word lines at at least a respective one of the remote terminals, said plurality of auxiliary circuits including respective deactivation auxiliary switches each of which, depending on an assigned auxiliary switching signal, selectively establishes and inhibits a low-impedance conductive connection between a respective one the remote terminals and said source for providing the deactivation potential; and a timing control circuit generating the respectively assigned auxiliary switching signal in a temporal relationship with the deactivation signal such that a corresponding one of the deactivation auxiliary switches is turned off while a corresponding one of said selectively addressable drivers of an assigned one of the word lines connects a corresponding one of the input terminals to the activation potential, and is turned on again as soon as said corresponding one of said selectively addressable drivers connects the corresponding one of the input terminals to the deactivation potential as a result of the deactivation signal becoming active.

2. The circuit configuration according to claim 1, wherein said timing control circuit generates a common auxiliary switching signal for all of said deactivation auxiliary switches such that the common auxiliary switching signal keeps all of said deactivation auxiliary switches turned off while any of said selectively addressable drivers connects a corresponding one of the input terminals of one of the word lines to the activation potential, and turns all of said deactivation auxiliary switches on again as soon as said selectively addressable drivers connect the input terminals of all of the word lines to the deactivation potential as a result of the deactivation signal becoming active.

3. The circuit configuration according to claim 2, wherein said timing control circuit generates the common auxiliary switching signal such that, after all of said deactivation auxiliary switches have been turned on, the common auxiliary switching signal turns said deactivation auxiliary switches off again at an earliest when, starting from a changeover of one of the input terminals to the deactivation potential, a time has elapsed which corresponds to a signal propagation time via the word lines from one of the input terminals to one of the remote terminals, and at a latest when any of said selectively addressable drivers changes one of the input terminals over again to the activation potential.

4. The circuit configuration according to claim 1, wherein:
the word lines form a total set divided into $m \geq 2$ disjoint sets, m being an integer value, such that between given ones of the word lines which each belong to a same given one of the disjoint sets there are m−1 word lines which do not belong to the given one of the disjoint sets;
said timing control circuit generates m separate auxiliary switching signals each respectively controlling exactly those of said deactivation auxiliary switches which are in each case connected to a same one of the disjoint sets; and
said timing control circuit generates the auxiliary switching signals depending on an addressing of said selectively addressable drivers such that each of the auxiliary switching signals turns off given ones of said deactivation auxiliary switches controlled by the auxiliary switching signals, only for a respective duration of intervals in which a respective one of said selectively addressable drivers connects one of the input terminals of one of the word lines of a corresponding one of the disjoint sets to the activation potential.

5. The circuit configuration according to claim 1, wherein each of said deactivation auxiliary switches is a transistor with a main current path connected between a respective one of the remote terminals and said source for providing the deactivation potential and said transistor has a control electrode for receiving an assigned one of the auxiliary switching signals.

6. The circuit configuration according to claim 5, wherein each of said deactivation auxiliary switches is a field-effect transistor.

7. The circuit configuration according to claim 1, wherein:
each of said auxiliary circuits further includes an activation auxiliary switching device receiving the assigned auxiliary switching signal and going into a standby state if the auxiliary switching signal turns off a corresponding one of said deactivation auxiliary switches; and said activation auxiliary switching device responds, when in the standby state, to a potential at a corresponding one of the remote terminals in order to establish a low-impedance connection between the corresponding one of the remote terminals and a source providing the activation potential if the potential at the corresponding one of the remote terminals has risen from the deactivation potential toward the activation potential by a threshold amount equal to a fraction of a difference between the deactivation potential and the activation potential, and in order to inhibit the low-impedance connection again at an earliest when a time has elapsed corresponding to a signal propagation time via the word lines from one of the input terminals to one of the remote terminals, and at a latest when the auxiliary switching signal turns on a corresponding one of said deactivation auxiliary switches in a corresponding one of said auxiliary circuits.

8. The circuit configuration according to claim 7, wherein said activation auxiliary switching device inhibits the low-impedance connection again when the auxiliary switching signal turns on a corresponding one of said deactivation auxiliary switches in a corresponding one of said auxiliary circuits.

9. The circuit configuration according to claim 8, wherein said activation auxiliary switching device includes:
an activation auxiliary switch having a control input and having a switching path connected between a corresponding one of the remote terminals and said source providing the activation potential;
a threshold switch having a control input connected to the corresponding one of the remote terminals and having a switching path connected between a line carrying the auxiliary switching signal and said control input of said activation auxiliary switch;
a discharge switch having a control input connected to the corresponding one of the remote terminals and having a control path connected between said control input of said activation auxiliary switch and said source providing the activation potential;
said threshold switch is in an on state only when a potential at said control input of said threshold switch one of reaches and exceeds said threshold amount;
said activation auxiliary switch is in an on state only when said control input of said activation auxiliary switch receives a potential which turns a corresponding one of said deactivation auxiliary switches off; and
said discharge switch is in an on state only when said control input of said discharge switch receives the deactivation potential.

10. The circuit configuration according to claim 9, wherein each of said deactivation auxiliary switches, said activation auxiliary switch, said threshold switch, and said discharge switch in each of said auxiliary circuits are field-effect transistors.

11. The circuit configuration according to claim 10, wherein, in each of said auxiliary circuits, a respective one of said field-effect transistors forming said discharge switch is configured for a lower saturation current than a respective one of said field-effect transistors forming said activation auxiliary switch.

* * * * *